United States Patent [19]

Takahashi

[11] 4,348,747
[45] Sep. 7, 1982

[54] SYSTEM FOR DRIVING BIPOLAR RAM

[75] Inventor: Yukio Takahashi, Shiga, Japan

[73] Assignee: Fujitsu Limited, Kawasaki, Japan

[21] Appl. No.: 123,643

[22] Filed: Feb. 22, 1980

[30] Foreign Application Priority Data

Feb. 28, 1979 [JP] Japan .................................. 54-23086

[51] Int. Cl.³ ............................................... G11C 7/00
[52] U.S. Cl. ..................................... 365/189; 365/190
[58] Field of Search ........................ 365/189, 190, 230

[56] References Cited

U.S. PATENT DOCUMENTS 3,916,394 10/1975 Fett ...................................... 365/190
4,172,291 10/1979 Owens et al. ....................... 365/189
4,204,276 5/1980 Glock et al. ........................ 365/189

Primary Examiner—Stuart N. Hecker
Attorney, Agent, or Firm—Staas & Halsey

[57] ABSTRACT

A system for driving a biopolar RAM, comprising: a first means for changing the potentials of word lines responsive to the selected, or non-selected state thereof, the potential of the one selected word line being higher than that of the other non-selected word lines; and a second means for changing the potentials of the non-selected word lines responsive to the read or write mode, the potentials of the non-selected word lines being lower during the read mode than during the write mode.

37 Claims, 23 Drawing Figures

SYSTEM FOR DRIVING BIPOLAR RAM

BACKGROUND OF THE INVENTION

1. Field of the Invention

The present invention relates generally to a bipolar memory system and, more particularly, to a system for driving a bipolar RAM (Random Access Memory).

2. Description of the Prior Art

In general, a bipolar RAM comprises a cell array composed of memory cells each of which includes a flip-flop formed by two transistors cross-coupled as a fundamental unit. Each of the memory cells is connected to a word line (W), a hold line (H) and a pair of bit lines (B, $\bar{B}$) by which the memory cells can be selected. In this case, selection of one word line, i.e. raising the potential thereof, is effected by a work decoder composed of row address buffers and word drivers.

One prior art system for driving a bipolar RAM is characterised in that the difference in potential between the selected word line and the non-selected word lines is substantially the same during the read mode and the write mode. However, usually, since the range of potential of the write operation is larger than that of the read operation, the above-mentioned difference in potential is set at the margin of operation of the write operation. As a result, during the read mode, when the state of one word line is changed from the non-selected to the selected mode, in other words, when the potential of one word line is changed from low to high, the time required to charge the word line with stray capacity is long, so that the reading speed of the memory cell is low.

In order to improve the reading speed performance, a system is known in the art for driving a bipolar RAM wherein the state of the selected word line is changed from the read mode to the write mode, whereby the voltage of the selected word line is forced to be higher (Ref. Japanese Public Disclosure No. 50-139635). Therefore, the difference in potential between the selected word line and the non-selected word lines during the read mode is set to be smaller than that during the write mode. As a result, the reading speed of the memory cell increases. However, in this system, as will be explained hereinafter, when the state of the selected word line is changed from the write mode to the read mode, the data written into the selected memory cell belonging to the selected word line may be destroyed.

SUMMARY OF THE INVENTION

It is a principal object of the present invention to provide a system for driving a bipolar RAM with high-speed and stable reading operation which incurs no data destruction in the read mode after the write mode.

According to the present invention, there is provided a system for driving a bipolar RAM, whose memory cells are selected by changing the potentials of word lines, comprising: a first means for changing the potentials of the word lines responsive to the selected or non-selected state thereof, the potential of the one selected word line being higher than that of the non-selected word lines; and a second means for changing the potentials of the non-selected word lines responsive to the read or write mode thereof, the potentials of said non-selected word lines being lower during the write mode than during the read mode, whereby the difference in potential between the selected word line and the non-selected word lines is smaller during the read mode than during the write mode. By using this system, the data written into the memory cells cannot be destroyed during the read mode after the write mode. In addition, during the read mode, the difference in potential between the selected word line and the non-selected word lines is set at the lower limit of the margin of operation for the read operation, so that the reading speed of the memory cells becomes high.

BRIEF DESCRIPTION OF THE DRAWINGS

The present invention will be more clearly understood from the following description with reference to the accompanying drawings, wherein.

DESCRIPTION OF THE PREFERRED EMBODIMENTS

Figure 1:
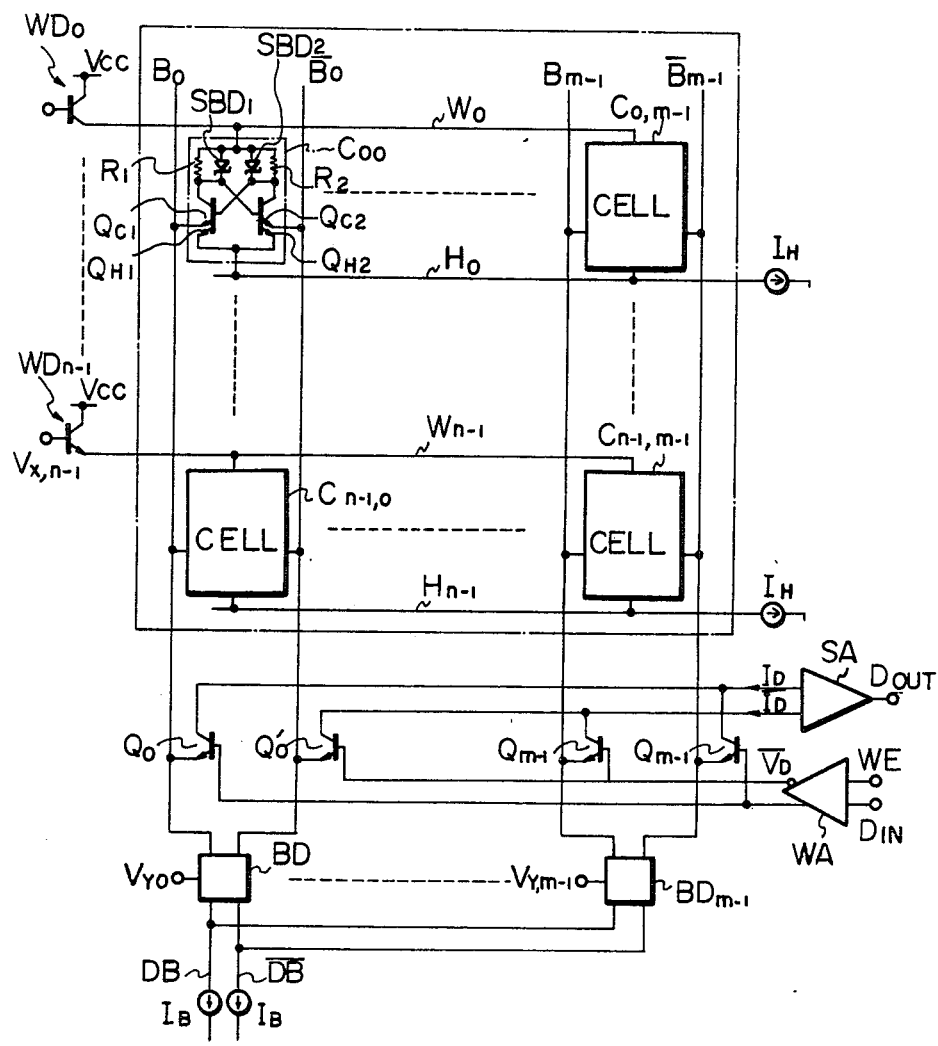
FIG. 1 is a block diagram illustrating the memory cell array of a general bipolar RAM whose memory cells are of a Schottky clamped type.

In FIG. 1, a memory array composed of memory cells $C_{ij}$ (i=0, 1, . . ., n−1; j=0, 1, . . ., m−1) whose matrix is n rows by m columns is shown. The memory cells $C_{ij}$ which are of a nonsaturating type (Schottky clamped type) comprise two cross-coupled multi-emitter transistors, the transistor elements of which are indicated by $Q_{C1}$ and $Q_{C2}$ whose emitters are connected to bit lines, and $Q_{H1}$ and $Q_{H2}$ whose emitters are connected to a hold line, two Schottky barrier diodes $SBD_1$ and $SBD_2$, and two load resistors $R_1$ and $R_2$, whereby a flip-flop is formed. The potentials at the collectors of the transistor elements $Q_{C1}$, $Q_{H1}$, $Q_{C2}$, and $Q_{H2}$ are clamped by the Schottky barrier diodes $SBD_1$ and $SBD_2$, so that the transistor elements do not enter into the saturation state. For example, the memory cell $C_{00}$ is located between a word line $W_D$ and a hold line $H_D$ through which a constant current $I_H$ flows and between a pair of bit lines $B_0$ and $\overline{B}_0$. The word line $W_D$ is selected by a word driver $WD_0$ and the bit line pair $B_0$ and $\overline{B}_0$ are selected by a bit driver $BD_0$ (not shown) so that the memory cell $C_{00}$ can be selected. However, it is also possible to select the memory cell $C_{00}$, even if only the word line $W_0$ and all the bit line pairs are selected. The sense amplifier SA detects the data stored in the memory cells during the read mode. The write amplifier WA produces output voltages $V_D$ and $\overline{V}_D$ whose values are different when the potential of a write-enable signal WE is low, which means the write mode, and whose values are the same when the potential of the write-enable signal WE is high, which means the read mode.

The operation of the memory cell array of FIG. 1 will be explained by using FIG. 2, which is the main portion of FIG. 1, and FIG. 3 which is a timing diagram showing the signals appearing in the circuit of FIG. 2. The access operation with regard to the memory cell $C_{00}$ (FIG. 1) is shown by the progression of the following steps, as illustrated in FIG. 3.

Step 1: Non-selected state;
Step 2: The read mode in the selected state;
Step 3: The write mode in the selected state;
Step 4: The read mode in the selected state; and
Step 5: Non-selected state.

In step 1, it is assumed that the transistor elements $Q_{H1}$ and $Q_{H2}$ of the memory cell $C_{00}$ which form a flip-flop are conductive and non-conductive respectively. In addition, the transistor elements $Q_{C1}$ and $Q_{C2}$ of the memory cell $C_{00}$ are non-conductive, since the cell $C_{00}$ is non-selected. Further, the voltages $V_D$ and $\overline{V}_D$ of the write amplifier WA(FIG. 1) are the same, which means the read mode. The collector potential $V_{BS}$ is represented as follows.

$$V_{BS} = V_{W0} - R \times I_{B1} \tag{1}$$

where R is the resistance of the resistor $R_2$ and $I_{B1}$ is the base current of the transistor element $Q_{H1}$. In this case, the value $R \times I_{B1}$ is very small so that the Schottky barrier diode $SBD_2$ cuts off. Contrary to this, the collector voltage $V_{CS}$ is represented as follows.

$$V_{CS} = V_{W0} - V_{BE} \tag{2}$$

where $V_{BE}$ is the forward voltage of the Schottky barrier diode $SBD_1$. In this case, the collector current $I_{C1}$ is relatively large so that the Schottky barrier diode $SBD_1$ is conductive.

In step 2, the voltage $V_{W0}$ of the word line $W_0$ is increased so that the collector voltages $V_{BS}$ and $V_{CS}$ are also increased, while the voltage $V_{W1}$ of the word line $W_1$ is decreased, as illustrated in FIG. 3. The voltages $V_D$ and $\overline{V}_D$, which are the same, are preset to be between the voltages $V_{BS}$ and $V_{CS}$. Preferably, the voltages $V_D$ and $\overline{V}_D$ equal $(V_{BS} + V_{CS})/2$. In this case, since the transistor element $Q_{C1}$, to whose base is applied the voltage $V_{BS}$, and a transistor $Q_0$, to whose base is applied the voltage $V_D$ which is smaller than the voltage $V_{BS}$ form a current switch, the transistor element $Q_{C1}$ conducts and the transistor $Q_0$ remains non-conductive. Similarly, since the transistor elements $Q_{C2}$ and the transistor $Q_0'$ form a current switch, the transistor element $Q_{C1}$ remains non-conductive and the transistor $Q_0'$ conducts. As a result, currents indicated by arrows X1 and X2 flow through data bit lines DB and $\overline{DB}$, respectively. Therefore, the currents $I_D$ and $\overline{I}_D$ supplied to the sense amplifier SA are represented as follows.

$$I_D = O \tag{3}$$

$$\overline{I}_D = I_B \tag{4}$$

In this case, the output data $D_{OUT}$ of the sense amplifier SA is, for example, the logic "0".

In step 3, the voltage $\overline{V}_D$ is decreased which means the write mode for writing the logic "1". When the voltage $\overline{V}_D$ equals the voltage $V_{CS}$ at time $t_1$, the emitter currents of the transistor element $Q_{C2}$ and the transistor $Q_0'$ becomes equal ($= \frac{1}{2} I_B$). Furthermore, when the voltage $\overline{V}_D$ becomes lower than the voltage $V_{CS}$, the emitter current of the transistor element $Q_{C2}$ becomes equal to $I_B$ and the emitter current of the transistor $Q_0'$ becomes zero. In this case, the difference in potential between the voltages $V_{CS}$ and $\overline{V}_D$ is, for example, higher than 200 mV. As a result, the voltages $V_{BS}$ and $V_{CS}$ become low and high, respectively, so that the state of the flip-flop is reversed. In this write mode, the voltage $V_D$ is increased in order to spend up the write operation. However, it should be noted that the voltage $V_D$ can remain at the same level as the read mode. In this case, the write speed becomes lower.

In step 4, the levels of the voltages $V_D$ and $\overline{V}_D$ are the same. In this case, currents indicated by arrows Y1 and Y2 flow through the data bit lines DB and $\overline{DB}$, respectively. Therefore, the currents $I_D$ and $\overline{I}_D$ supplied to the sense amplifier SA are represented as follows.

$$I_D = I_B \tag{5}$$

$$\overline{I}_D = O \tag{6}$$

In this case, the output data $D_{OUT}$ of the sense amplifier SA is the logic "1".

In step 5, the voltage $V_{W0}$ of the word line $W_0$ is decreased so that the collector voltages $V_{BS}$ and $V_{CS}$ are also decreased. However, the decrease of the voltages $V_{BS}$ and $V_{CS}$ takes a longer time than the decrease of the voltage $V_{W0}$. Contrary to this, the voltage $V_{W1}$ of the word line $W_1$ is increased.

In steps 2, 3 and 4 wherein the memory cell $C_{00}$ is selected and the memory cell $C_{01}$ is non-selected, both of the voltages $V_{BN}$ and $V_{CN}$ of the memory cell $C_{01}$ should always be lower than the voltage $V_D$ and $\overline{V}_D$ so that the transistor elements $Q_{C1}$ and $Q_{C2}$ thereof are always nonconductive. Therefore, access into the memory cell $C_{01}$ is never effected.

In the above-mentioned access operation, there are some operating requirements. One such requirement is that the voltage $\overline{V}_D$ and the voltage $V_{W1}$ during the write mode in the selected state (Step 3) should satisfy the following inequality.

$$\overline{V}_D > V_{W1} \tag{7}$$

In other words, the voltages $V_D$ and $\overline{V}_D$ should be higher than the voltage of the non-selected word line. Otherwise, if the transistor element $Q_{H2}$ of the nonselected memory cell $C_{01}$ is conductive, the transistor element $Q_{C2}$ conducts so that current from the non-selected memory cell $C_{01}$ flows through the bit line $\bar{B}_0$. As a result, it takes a long time for the transistor element $Q_{C2}$ of the selected memory cell $C_{00}$ to conduct, which means that the write speed for the selected memory cell is low. At worst, the write operation may not occur. It should be noted that the difference $\Delta V_1$ in potential between the volgates $V_{BS}$ and $V_{CS}$ is about 400 or 500 mV and the difference $\Delta V_2$ in potential between the voltages $V_{CS}$ and $V_D$ is about 200 mV in the non-saturating type memory cells using Schottky barrier diodes (FIG. 1). In addition, the difference $\Delta V_1$ in potential is about 700 mV in the saturating type memory cells using p-n junction diodes.

Another such condition is that the voltage $V_{W1}$ and the voltage $V_D$ ($=\bar{V}_D$) during the read mode in the selected state (Steps 2 and 4) should satisfy the following inequality.

$$V_{W1} < V_D (=\bar{V}_D) \tag{8}$$

$V_{W0} < V_D (=V_D)$ in steps 1 and 5)

In other words, the voltage of the non-selected word line should be lower than the voltage $V_D$ ($=\bar{V}_D$). Otherwise, in the case of step 2, the current $I_B$ flowing through the data bit line $\overline{DB}$ comes from both the transistor $Q_0'$ and the transistor element $Q_{C2}$ of the non-selected read mode, and the time (which corresponds to $\Delta t$ in FIG. 3) required to charge the word line with its stray capacitance is long, so that the reading speed of the memory cell is slow.

Figure 2:
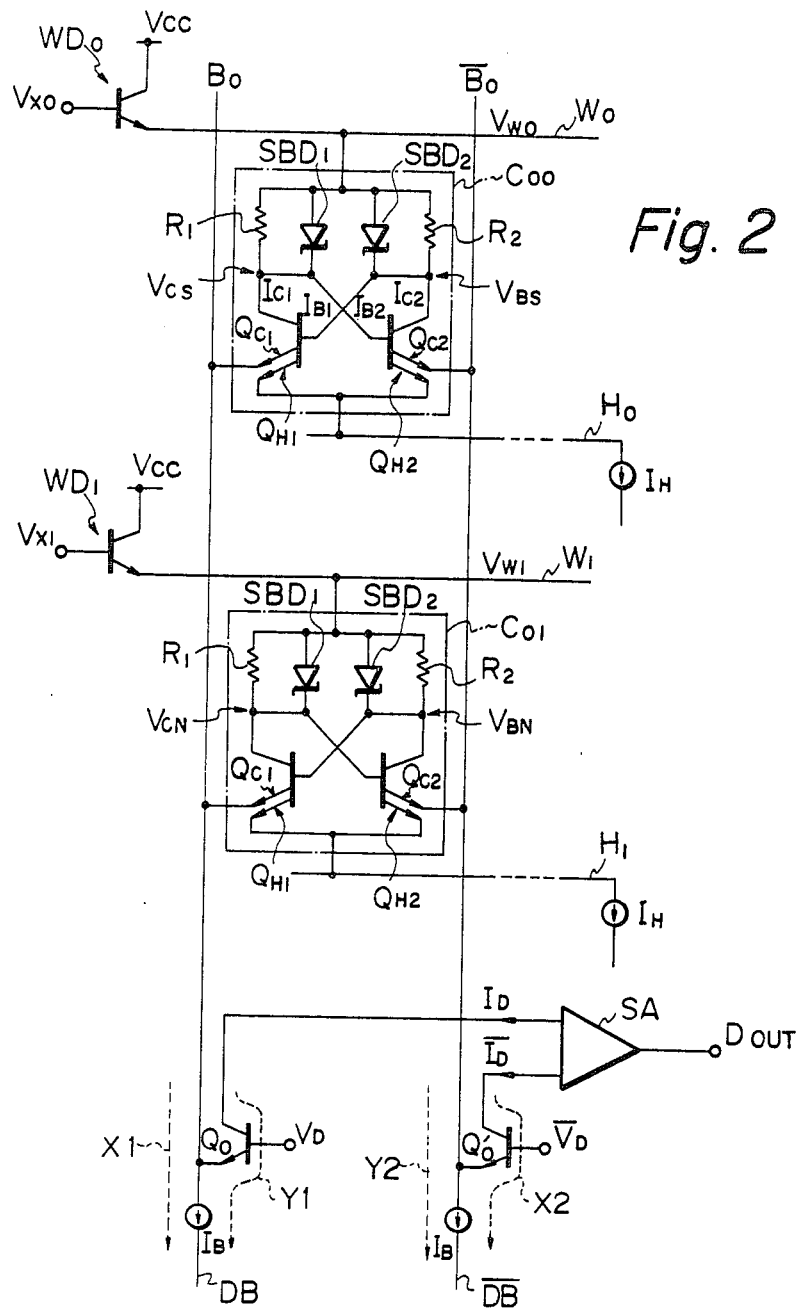
FIG. 2 is the main portion of FIG. 1.
Figure 3:
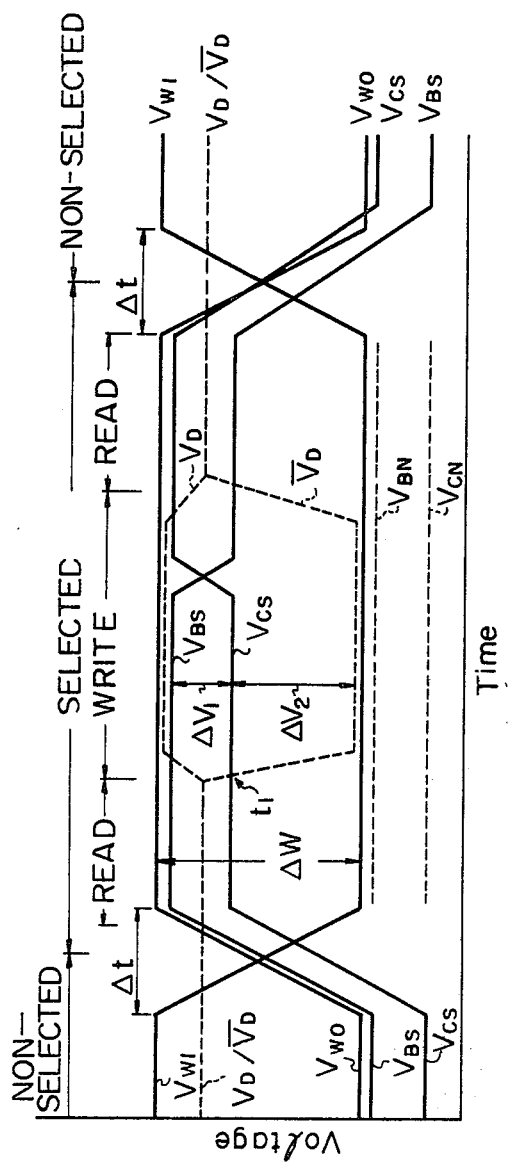
FIG. 3 is a timing diagram showing the signals appearing in the circuit of FIG. 2, by using a driving system of the prior art.
Figure 4:
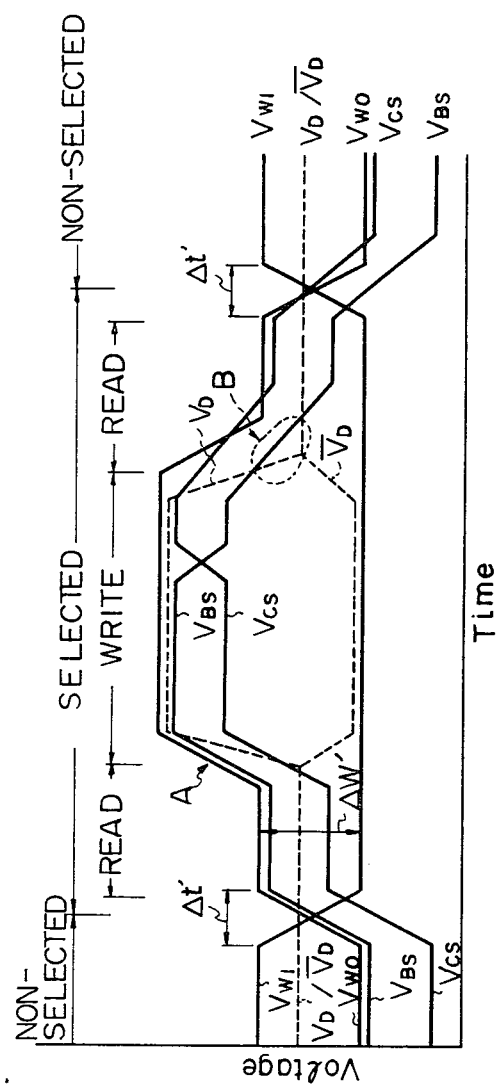
FIG. 4 is a timing diagram showing the signals appearing in the circuit of FIG. 2, by using another driving system of the prior art.

FIG. 4 is a timing diagram showing signals appearing in the circuit of FIG. 2, by using another driving system of the prior art (Ref. Japanese public Disclosure No. 50-139635). In FIG. 4, when the state of the selected word line $W_0$ is changed from the read mode to the write mode, the voltage $V_{W0}$ of the selected word line $W_0$ is changed higher, as indicated by an arrow A. Therefore, during the read mode, the difference $\Delta W'$ in potential between the selected word line $W_0$ and the non-selected word line $W_1$ is smaller than the difference $\Delta W$ (FIG. 3) in potential. As a result, the time (which corresponds to $\Delta t'$) required to charge the selected word line with its stray capacitance is smaller than the time $\Delta t$ (FIG. 3), which means that the reading speed of the operation as illustrated in FIG. 4 is faster than that as illustrated in FIG. 3. However, as illustrated in FIG. 4, when the state of the selected word line $W_0$ is changed from the write mode to the read mode, the voltages $V_{BS}$ and $V_{CS}$ decrease more slowly than the voltages $V_D$ and $\bar{V}_D$. As a result, a phenomenon occurs where the voltage $V_D$ is lower than the voltage $V_{BS}$ (as indicated in FIG. 4 by area B) so that the transistor element $Q_{C1}$ conducts and, accordingly, the transistor element $Q_{H1}$ also conducts. This means that the data stored in the selected memory cell $C_{00}$ is destroyed, since the transistor element $Q_{H2}$ was already conductive.

Figure 5:
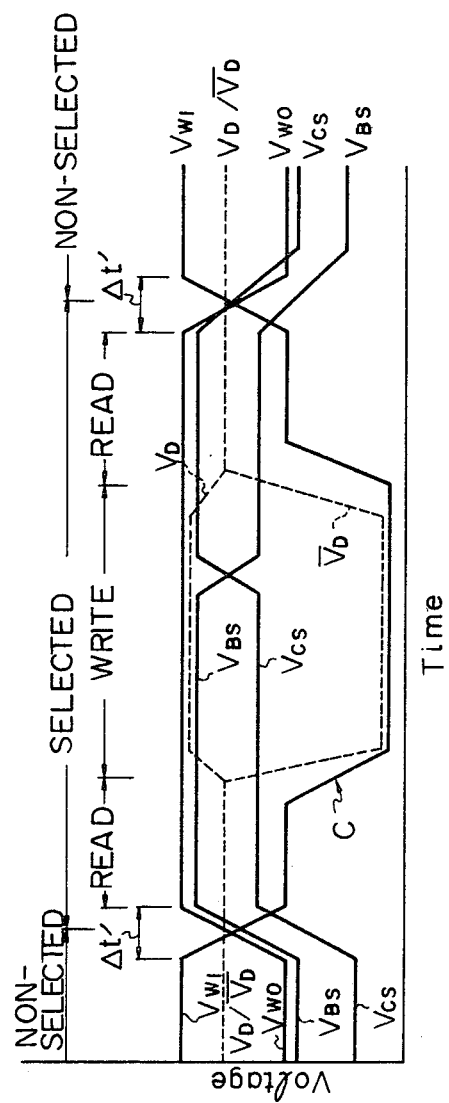
FIG. 5 is a timing diagram showing the signals appearing in the circuit of FIG. 2, by using the driving system according to the present invention.

FIG. 5 is a timing diagram showing the signals appearing in the circuit of FIG. 2, by using the driving system according to the present invention. In FIG. 5, when the state of the selected word line $W_0$ is changed from the read mode to the write mode, the voltage $V_{W1}$ of the non-selected word line $W_1$ is changed to be lower, as indicated by an arrow C. Therefore, in the same manner as in FIG. 4, during the read mode, the difference $\Delta W'$ in potential between the selected word line $W_0$ and the non-selected word line $W_1$ is small, so that the time which corresponds to $\Delta t'$ required to charge the selected word line and its stray capacitance is small. Therefore, the reading speed of the operation, as illustrated in FIG. 5, is also high. Further, after the state of the selected memory cell $C_{00}$ is changed from the write mode to the read mode, the voltage $V_D$ is never lower than the voltage $V_{BS}$, so that the data stored in the selected memory cell $C_{00}$ will not be destroyed.

Figure 6:
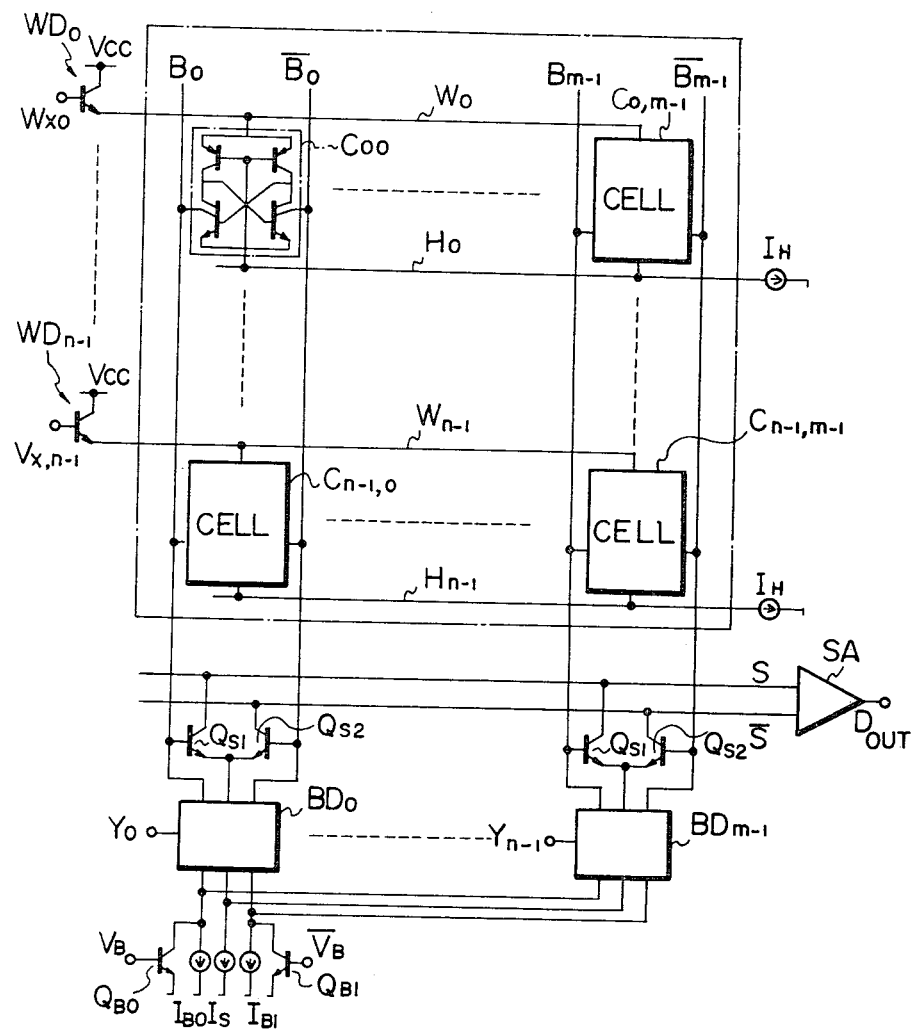
FIG. 6 is a block diagram illustrating the memory cell array of another bipolar RAM whose memory cells are of an IIL (Integrated Injection Logic) type.

FIG. 6 is a block diagram illustrating the memory cell array of another general bipolar RAM, whose memory cells are of an IIL (Integrated Injection Logic) type. In the read mode of the memory cell array of FIG. 6, for example, the difference in potential between bit lines $B_0$ and $\bar{B}_0$ is amplified by a differential amplifier formed by two transistors $Q_{S1}$ and $Q_{S2}$, so that the amplified signals are supplied to a sense amplifier SA. In the write mode of the memory cell array of the FIG. 6, one of two transistors $Q_{B0}$ and $Q_{B1}$ is conductive and the other is non-conductive. Therefore, the conditions represented by the above-mentioned inequalities (7) and (8) are unnecessary. However, it is preferable, during the read mode, for the difference in potential between the selected word line and the non-selected word lines to be small, which permits a fast reading operation. Therefore, the driving system whose operation is illustrated in FIG. 5 is applied to the memory cell array of FIG. 6.

Figure 7:
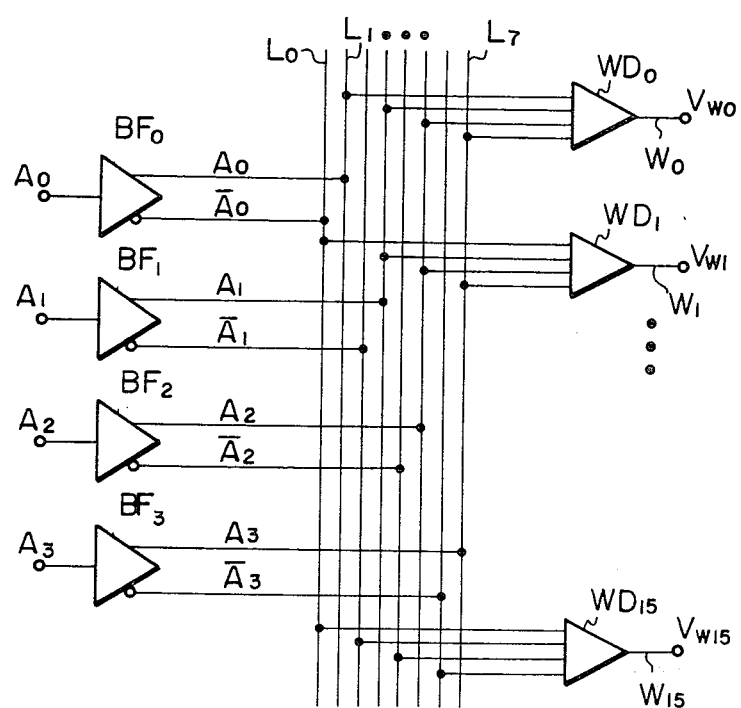
FIG. 7 is a circuit diagram illustrating a general decoder/driver circuit.

FIG. 7 is a circuit diagram illustrating a general decoder/driver circuit. In FIG. 7, it is assumed that there are sixteen word lines $W_0, W_1, \ldots, W_{15}$ so that four address signals $A_0, A_1, A_2$, and $A_3$ ($2^4=16$) are necessary. The address signals $A_0, A_1, A_2$, and $A_3$ are applied to address buffers $BF_0, BF_1, BF_2$, and $BF_3$, respectively, so that the address buffers produce the signals $A_0, A_1, A_2$, and $A_3$ and their inverted signals $\overline{A_0}, \overline{A_1}, \overline{A_2}$ and $\overline{A_3}$ to bus lines $L_0, L_1, \ldots, L_7$. Each of sixteen word drivers $WD_0, WD_1, \ldots, WD_{15}$ have four inputs, which are connected to one of the lines $L_0$ and $L_1$, one of the lines $L_2$ and $L_3$, one of the lines $L_4$ and $L_5$, and one of the lines $L_6$ and $L_7$, respectively. Therefore, only one of the word drivers $WD_0, WD_1, \ldots, WD_{15}$ is switched on, and the others are switched off. In other words, only one of the word lines $W_0, W_1, \ldots, W_{15}$ is selected and the other word lines are non-selected.

Figure 8A:
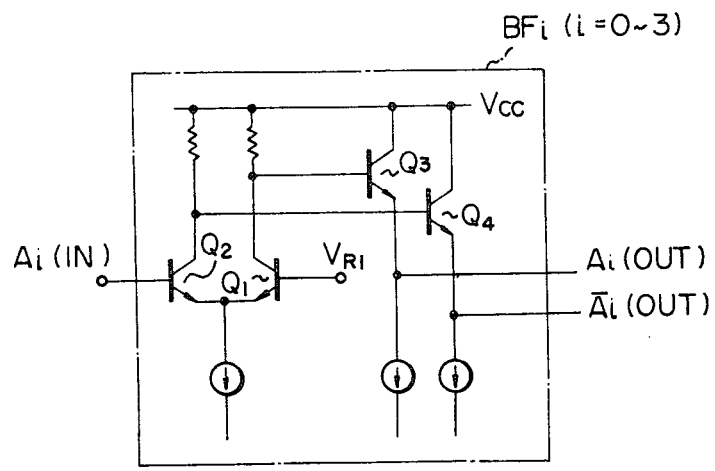
FIGS. 8A and 8B are two kinds of circuit diagrams of the address buffer $BF_i$ of the decoder/driver circuit of FIG. 7.
Figure 8B:
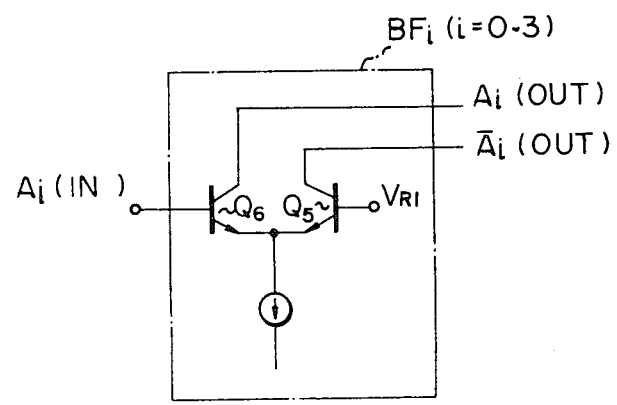

FIGS. 8A and 8B are two kinds of circuit diagrams of the address buffer $BF_i$ of the decoder/driver circuit of FIG. 7. In FIG. 8A, two transistors $Q_1$ and $Q_2$ form a current switch. When the voltage of the address signal Ai(IN) is lower than a reference voltage $V_{R1}$, the transistors $Q_1$ and $Q_2$ are conductive and non-conductive, respectively, so that the base voltages of the transistors $Q_3$ and $Q_4$ are low and high, respectively. As a result, the voltages of signals Ai(OUT) and $\overline{Ai}$(OUT) are low and high, respectively. Contrary to this, when the voltage of the address signal Ai(IN) is higher than the reference voltage $V_{R1}$, the voltages of signals Ai(OUT) and $\overline{Ai}$(OUT) are high and low, respectively.

In FIG. 8B, two transistors $Q_5$ and $Q_6$ form a current switch. Therefore, when the voltage of the address signal Ai(IN) is lower than a reference voltage $V_{R1}$, the transistors $Q_5$ and $Q_6$ are conductive and non-conductive, respectively, so that current signals Ai(OUT) and $\overline{Ai}$(OUT) are in an off-state and on-state, respectively. Contrary to this, when the voltage of the address signal Ai(IN) is higher than the reference voltage $V_{R1}$, the current signals Ai(OUT) and $\overline{Ai}$(OUT) are in an on-state and off-state, respectively.

Figure 9A:
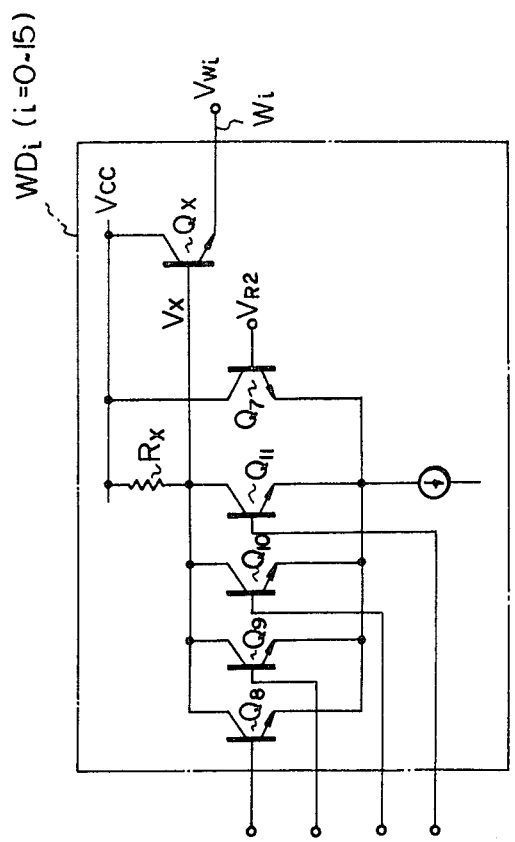
FIGS. 9A, 9B and 9C are three kinds of circuit diagrams of the driver portion of the decoder/driver circuit of FIG. 7.
Figure 9B:
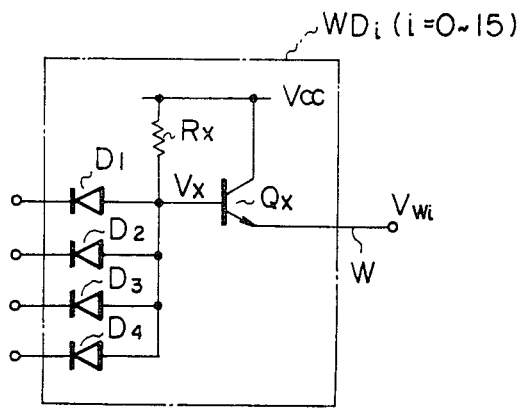
Figure 9C:
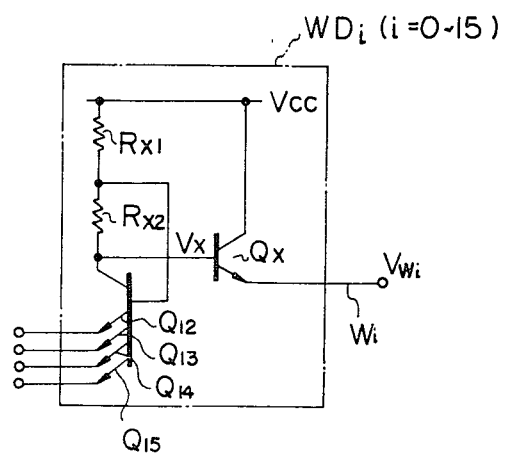

FIGS. 9A, 9B and 9C are three kinds of circuit diagrams of the driver portion of the decoder/driver circuit of FIG. 7. In FIG. 9A, transistors $Q_7$, $Q_8$, $Q_9$, $Q_{10}$, and $Q_{11}$ form a current switch. Therefore, when all the base voltages of the transistors $Q_8$, $Q_9$, $Q_{10}$, and $Q_{11}$ are lower than a reference voltage $V_{R2}$ of the transistor $Q_7$, all the transistors $Q_8$, $Q_9$, $Q_{10}$, and $Q_{11}$ are non-conductive, so that the base voltage $V_X$ of a transistor $Q_X$ is high ($\approx V_{CC}$) and, accordingly, the voltage $V_{Wi}$ of the word line $W_i$ is high. This means that the word line $W_i$ is selected. Contrary to this, when at least one of the base voltages of the transistors $Q_8$, $Q_9$, $Q_{10}$, and $Q_{11}$ are higher than the reference voltage $V_{R2}$, a current flows through a resistor $R_x$ so that the voltage $V_X$ is low and, accordingly, the voltage $V_{Wi}$ of the word line $W_i$ is low. This means that the word line $W_i$ is non-selected. In FIG. 9B, when all diodes $D_1$, $D_2$, $D_3$, and $D_4$ are non-conductive, the voltage $V_X$ is high ($\approx V_{CC}$) and, accordingly, the voltage $V_{Wi}$ of the word line $W_i$ is high (selected state). Contrary to this, when at least one of the diodes is conductive, the voltage $V_X$ is low and, accordingly, the voltage $V_{Wi}$ of the word line $W_i$ is low (non-selected state). In FIG. 9C, a multi-emitter transistor is shown, whose elements are indicated by $Q_{12}$, $Q_{13}$, $Q_{14}$, and $Q_{15}$. The transistor elements $Q_{12}$, $Q_{13}$, $Q_{14}$, and $Q_{15}$ correspond to the diodes $D_1$, $D_2$, $D_3$, and $D_4$, respectively. Therefore, the operation of the word driver of FIG. 9C is similar to that of FIG. 9B.

Returning to FIG. 7, in a case where the address buffers $BF_0$, $BF_1$, $BF_2$, and $BF_3$ are those of FIG. 8A, the word drivers $WD_0$, $WD_1$, ..., $WD_{15}$ should be those of FIG. 9A. On the other hand, in a case where the address buffers $BF_0$, $BF_1$, $BF_2$, and $BF_3$ are those of FIG. 8B, the word drivers $WD_0$, $WD_1$, ..., $WD_{15}$ should be those of FIG. 9B or 9C.

Figure 10:
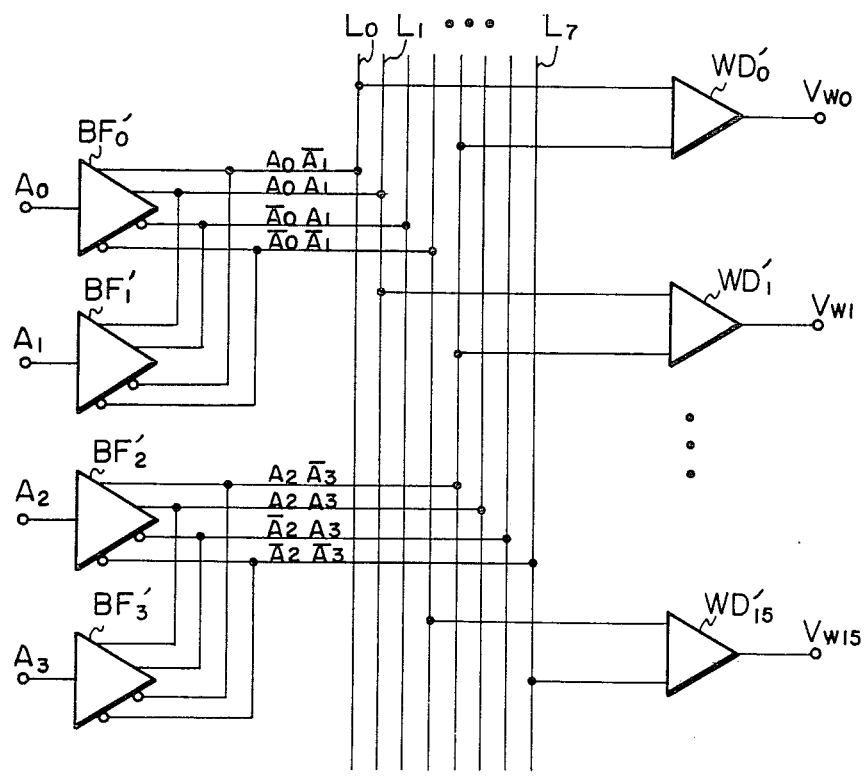
FIG. 10 is a circuit diagram illustrating another general decoder/driver circuit.

FIG. 10 is a circuit diagram illustrating another general decoder/driver circuit. In FIG. 10, two address signals $A_0$ and $A_1$ are converted into four signals $A_0\overline{A_1}$, $A_0A_1$, $\overline{A_0}A_1$, and $\overline{A_0A_1}$ by address buffers $BF_0'$ and $BF_1'$, while two address signals $\overline{A_2}$ and $A_3$ are converted into four signals $A_2A_3$, $A_2\overline{A_3}$, $\overline{A_2}A_3$ and $\overline{A_2A_3}$ by address buffers $BF_2'$ and $BF_3'$. Here, an expression such as $A_0A_1$ denotes a logical sum between $A_0$ and $A_1$. Each of the sixteen word drivers $WD_0'$, $WD_1'$, ..., $WD_{15}'$ has two inputs, which receive one of the signals $A_0\overline{A_1}$, $A_0A_1$, $\overline{A_0}A_1$, and $\overline{A_0A_1}$ and one of the signals $A_2A_3$, $A_2\overline{A_3}$, $\overline{A_2}A_3$, and $\overline{A_2A_3}$, respectively. Therefore, only one of the word drivers $WD_0'$, $WD_1'$, ..., $WD_{15}'$ is switched on and the others are switched off. In other words, only one of the word lines $W_0$, $W_1$, ..., $W_{15}$ is selected and the other word lines are non-selected.

Figure 11:
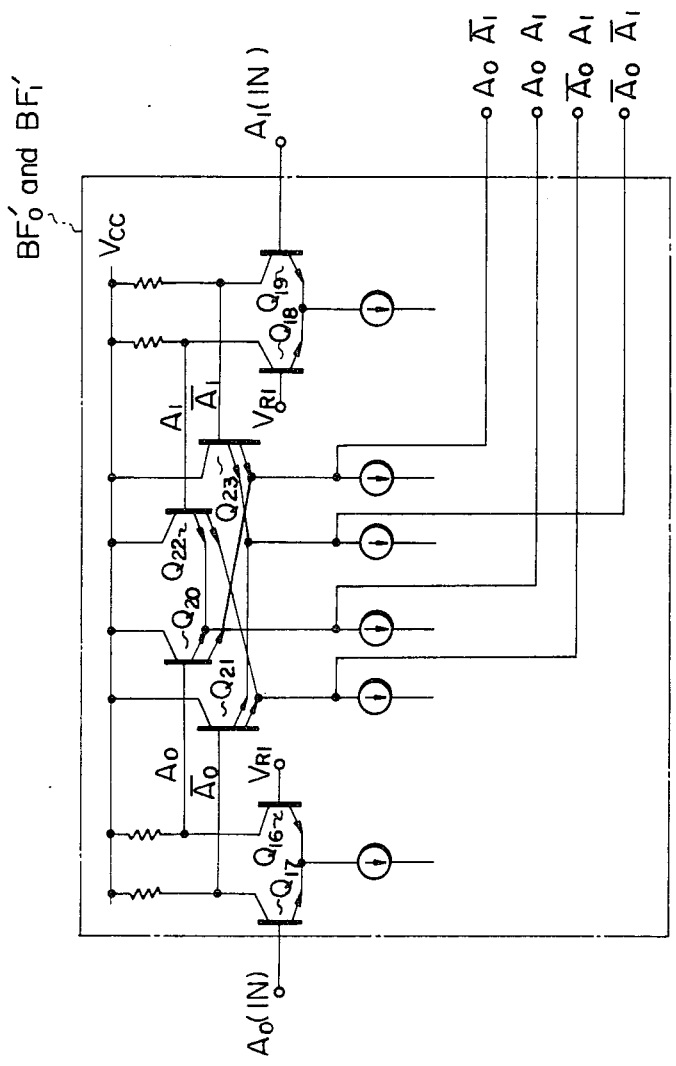
FIG. 11 is a circuit diagram of the address buffers $BF_0'$ and $BF_1'$ of the decoder/driver circuit of FIG. 10.

FIG. 11 is a circuit diagram of the address buffers $BF_0'$ and $BF_1'$ of the decoder/driver circuit of FIG. 10. In FIG. 11, two transistors $Q_{16}$ and $Q_{17}$ form a current switch and two transistors $Q_{18}$ and $Q_{19}$ form a current switch. Therefore, two address signals $A_0(IN)$ and $A_1(IN)$ are converted into the signals $A_0$ and $A_1$ and their inverted signals $\overline{A_0}$ and $\overline{A_1}$ by the current switches. The signals $A_0$, $A_1$, $\overline{A_0}$, and $\overline{A_1}$ are supplied to four multi-emitter transistors $Q_{20}$, $Q_{21}$, $Q_{22}$, and $Q_{23}$ which form four current switches which produce signals $A_0\overline{A_1}$, $A_0A_1$, $\overline{A_0}A_1$, and $\overline{A_0A_1}$.

Figure 12:
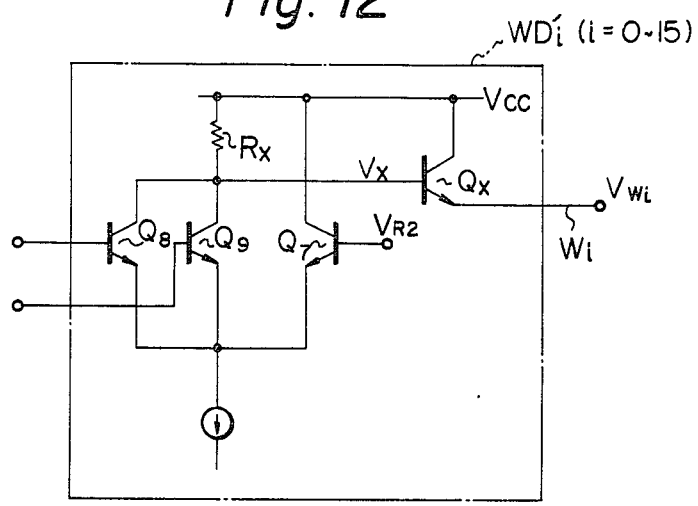
FIG. 12 is a circuit diagram of the driver portion of the decoder/driver circuit of FIG. 10.

FIG. 12 is a circuit diagram of the driver portion of the decoder/driver circuit of FIG. 10. The circuit of FIG. 12 is the same as that of FIG. 9A, except for the number of inputs. Therefore, the operation of the circuit of FIG. 12 is similar to that of FIG. 9A.

Figure 13:
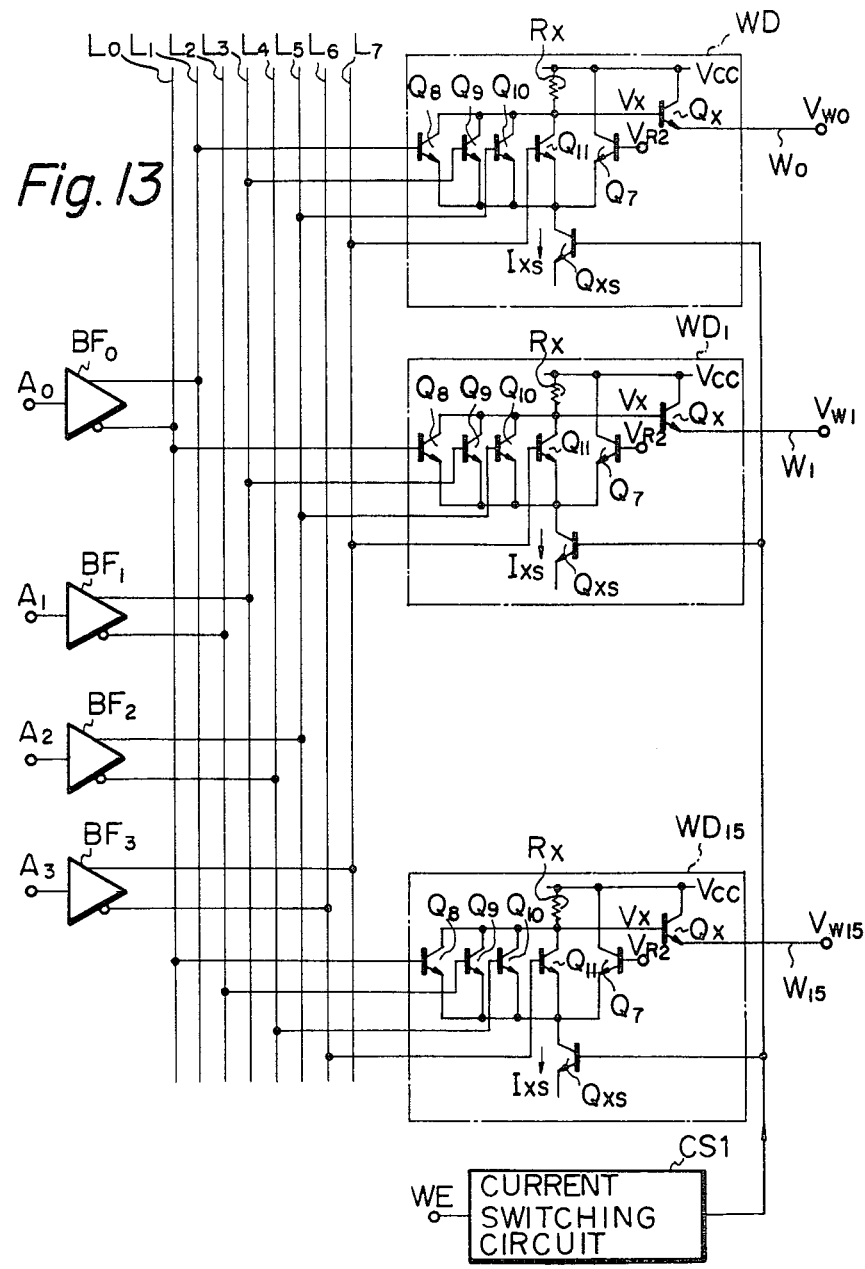
FIG. 13 is a circuit diagram illustrating a first embodiment of the decoder/driver circuit of the present invention.

FIG. 13 is a circuit diagram illustrating a first embodiment of the decoder/circuit of the present invention. The elements in FIG. 13 which are identical to those of FIGS. 7 and 9A are denoted by the same reference numerals as used in FIGS. 7 and 9A. As understood from FIG. 13, each of the word drivers $WD_0$, $WD_1$, ..., $WD_{15}$ is the same as that of FIG. 9A, except that the constant current source denoted by $Q_{XS}$ is controlled by a current switching circuit CS1. The current switching circuit CS1 which receives a write enable signal WE produces a signal whose voltage is high or low depending upon whether it is for the write mode or the read mode. For example, in the non-selected word line $W_1$, at least one of the transistors $Q_8$, $Q_9$, $Q_{10}$, and $Q_{11}$ are conductive so that the current flowing through the resistor $R_x$ (whose value is also represented by $R_x$) is the same as the current $I_{XS}$ flowing the transistor $Q_{XS}$. As a result, the voltage $V_X$ is low ($=V_{CC}-I_{XS}.R_x$). In addition, the current $I_{XS}$ in the write mode is larger than that in the read mode and, accordingly, the voltage $V_X$ is lower in the write mode than in the read mode. Therefore, the voltage $V_{W1}$ is lower in the write mode than in the read mode. Contrary to this, in the selected word line $W_0$, all the transistors $Q_8$, $Q_9$, $Q_{10}$, and $Q_{11}$ are non-conductive so that the voltage $V_X$ is always high ($\approx V_{CC}$) regardless of the write or read modes. Therefore, the decoder/driver circuit of FIG. 13 can be operated as illustrated in FIG. 5. The embodiment of FIG. 13 can be also used in FIG. 10.

Figure 14:
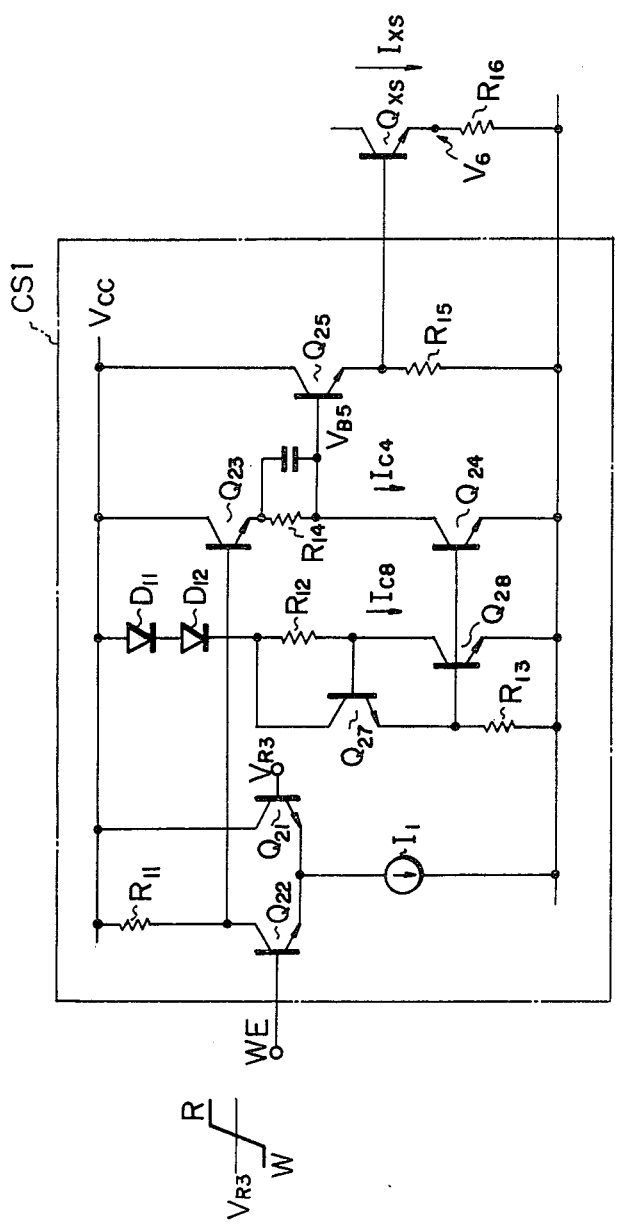
FIG. 14 is a circuit diagram of the current switching circuits CS1 of FIG. 13.

FIG. 14 is a circuit diagram of the current switching circuit CS1 of FIG. 13. In FIG. 14, it is assumed that, in the write mode, the voltage of the write enable signal WE is lower than a reference voltage $V_{R3}$, while in the read mode, the voltage of the signal WE is higher than the reference voltage $V_{R3}$. Therefore, in the write mode, a transistor $Q_{21}$ which forms a current switch with a transistor $Q_{22}$ is conductive and the transistor $Q_{22}$ is non-conductive. As a result, the base voltage of a transistor $Q_{23}$ becomes high and, accordingly, the base voltage of a transistor $Q_{25}$ becomes high. As a result, the current $I_{XS}$ is increased. The operation of the write mode will be explained in more detail. If it is assumed that each of the forward voltages of diodes $D_{11}$ and $D_{12}$ and each of the base-emitter voltages of transistors $Q_{27}$ and $Q_{28}$ are the same ($=V_{BE}$), the collector current $I_{C8}$ of the transistor $Q_{28}$ is represented as follows.

$$I_{C8} = \frac{V_{CC} - 4V_{BE}}{R_{12}}$$

where $R_{12}$ represents the resistance value of a resistor $R_{12}$ as well as the resistor $R_{12}$ itself. If the emitter area of a transistor $Q_{24}$ is the same as that of the transistor $Q_{28}$, the collector current $I_{C4}$ of the transistor $Q_{24}$ equals $I_{C8}$. Therefore, the voltage drop $\Delta V$ of a resistor $R_{14}$, whose value is also represented by $R_{14}$, is represented as follows.

$$\Delta V = I_{C8} \cdot R_{14}$$

$$= \frac{R_{14}}{R_{12}}(V_{CC} - 4V_{BE})$$

Here, if the value $R_{14}$ equals the value $R_{12}$, then $$\Delta V = V_{CC} - 4V_{BE}$$

Since the transistor $Q_{22}$ is non-conductive, the base voltage of the transistor $Q_{23}$ is $V_{CC}-V_{BE}$, and the base voltage $V_{B5}$ of the transistor $Q_{25}$ is represented as follows.

$$V_{B5} = V_{CC} - V_{BE} - (V_{CC} - 4V_{BE})$$
$$3V_{BE}$$

Since the voltage $V_6$ of a node connecting the transistor $Q_{XS}$ and a resistor $R_{16}$ is obtained by subtracting the drop in voltage of the transistors $Q_{25}$ and $Q_{XS}$ from the voltage $V_{B5}$, the voltage $V_6$ is represented by $$V_6 = 3V_{BE} - V_{BE} \times 2 = V_{BE}$$

Thus, the value $V_{BE}$ determines the constant current $I_{XS}$ in the write mode.

On the other hand, in the read mode, the transistors $Q_{21}$ and $Q_{22}$ are non-conductive and conductive, respectively. As a result, the base voltage of the transistor $Q_{23}$ becomes lower by a voltage drop of $I_1 R_{11}$. Since this voltage drop cause a drop in the voltage $V_6$ of magnitude $I_1 \cdot R_{11}$, the voltage $V_6$ is represented as follows.

$$V_6 = V_{BE} - I_1 \cdot R_{11}$$

Thus, the value $(V_{BE}-I_1 \cdot R_{11})$ determines the constant current $I_{XS}$ in the read mode.

Figure 15:
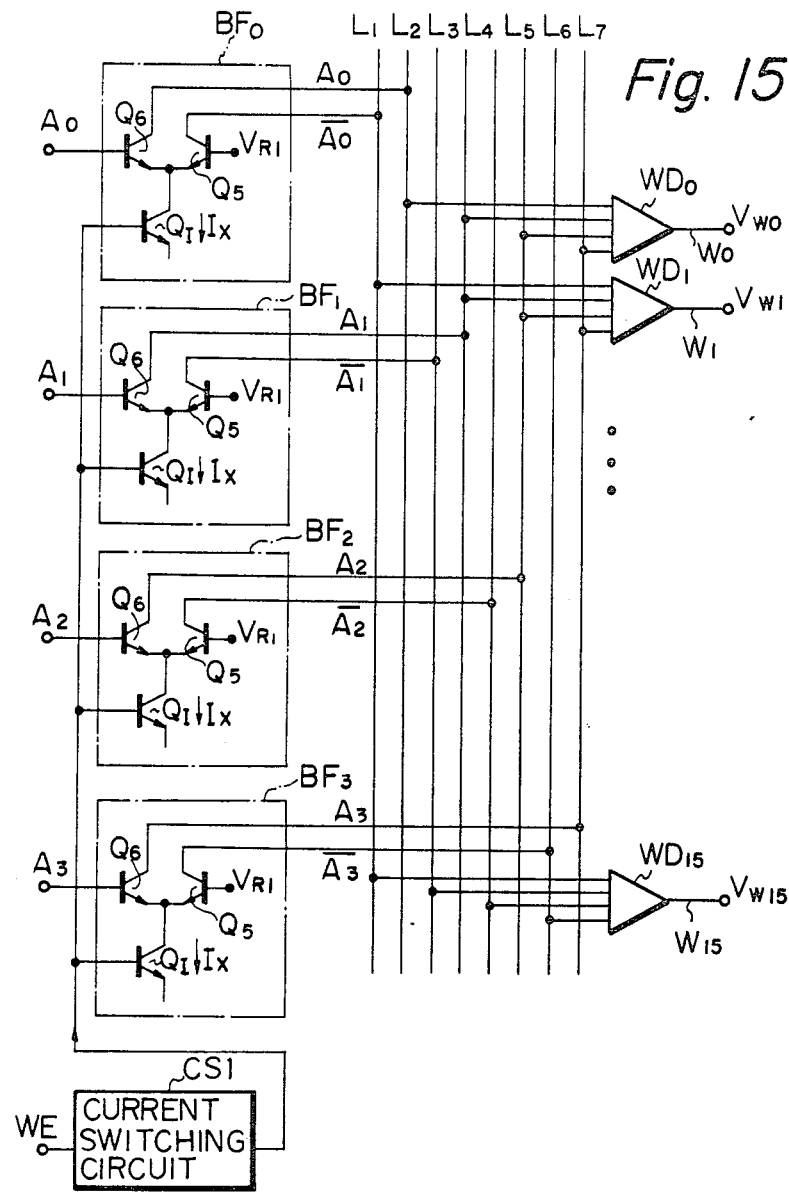
FIGS. 15 and 16 are circuit diagrams illustrating second and third embodiments of the decoder/driver circuit of the present invention, respectively.

FIG. 15 is a circuit diagram illustrating a second embodiment of the decoder/driver circuit of the present invention. The elements in FIG. 13 which are identical to those of FIGS. 7 and 8B are denoted by the same reference numerals as used in FIGS. 7 and 8B. As understood from FIG. 15, each of the address buffers $BF_0$, $BF_1$, $BF_2$, and $BF_3$ is the same as that of FIG. 8B, except that the constant current source denoted by $Q_I$ is controlled by the current switching circuit CS1 of FIG. 14. In this case, each of the word drivers $WD_0$, $WD_1$, ..., $WD_{15}$ is the same as that of FIG. 9B or 9C. The current $I_X$ is larger in the write mode than in the read mode. As a result, in the write mode, the output currents from the address buffers become large, which tends to cause an increase in current flowing through the resistor $R_X$ (FIG. 9B) or the resistors $R_{X1}$ and $R_{X2}$ (FIG. 9C) which belong to a non-selected word driver such as $WD_1$. However, in the selected word driver such as $W_0$, the voltage $V_X$ in FIG. 9B or 9C remains high ($\approx V_{CC}$) regardless of the write or read mode. Therefore, the decoder/driver circuit of FIG. 15 can be operated as illustrated in FIG. 5.

Figure 16:
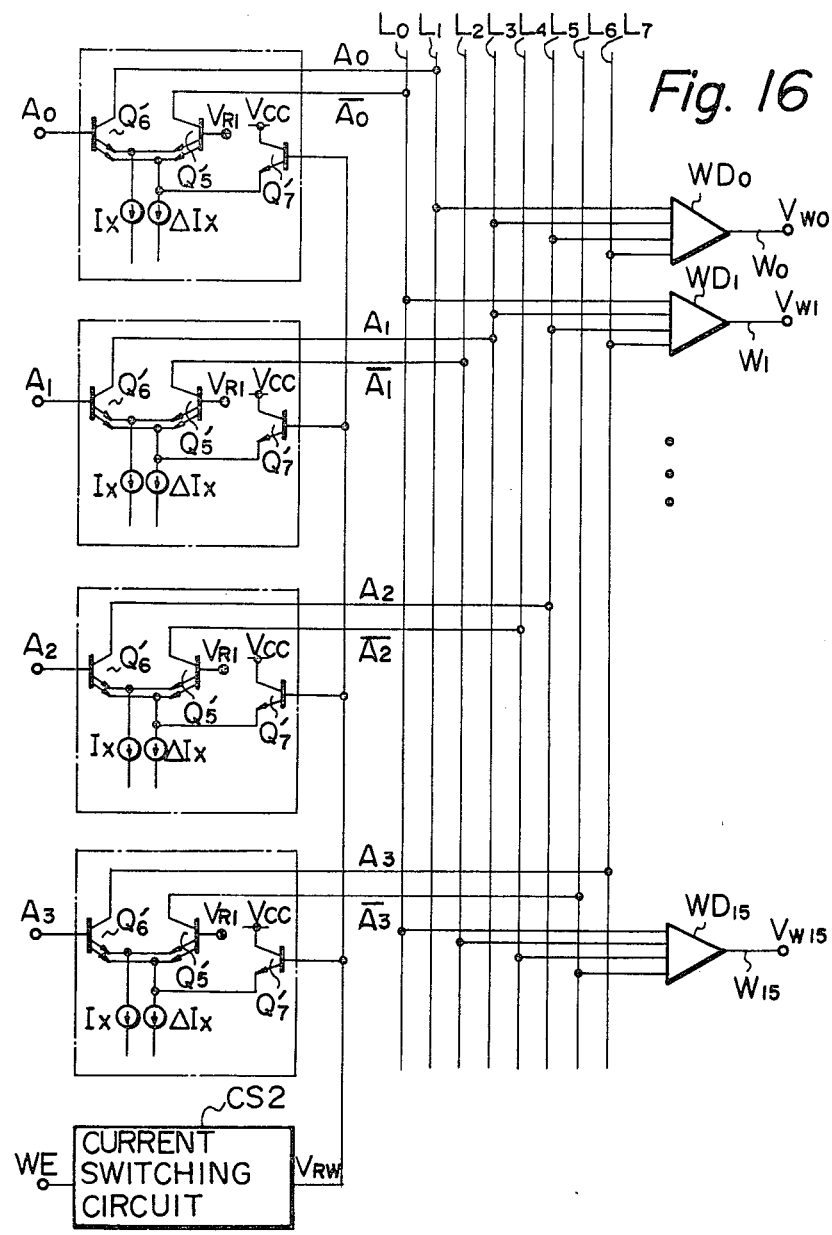

FIG. 16 is a circuit diagram illustrating a third embodiment of the decoder/driver circuit of the present invention. The elements in FIG. 16 which are identical to those of FIGS. 7 and 8B are denoted by the same reference numerals as used in FIGS. 7 and 8B. As understood from FIG. 16, each of the address buffers $BF_0 BF_1$, $BF_2$, and $BF_3$ comprises two multi-emitter transistors $Q_5'$ and $Q_6'$, and a transistor $Q_7'$. With regard to a constant current source $I_X$, the transistors $Q_5'$ and $Q_6'$ form a current switch, and with regard to a constant current source $\Delta I_X$, the transistors $Q_5'$, $Q_6'$ and $Q_7'$ form a current switch. In addition, each of the word drivers $WD_0$, $WD_1$, ..., $WD_{15}$ is also the same as that of FIG. 9B or 9C. In each of the address buffers $BF_0$, $BF_1$, $BF_2$, and $BF_3$, the base voltage $V_{RW}$ of the transistor $Q_7$ is controlled by a current switching circuit CS2. The current switching circuit CS2 which receives a write enable signal WE produces a signal $V_{RW}$. In the read mode, the voltage $V_{RW}$ of the current switch circuit CS2 is higher than any of the reference voltages $V_{R1}$ or the voltages of the address signals, so that the current $\Delta I_X$ flows through the transistor $Q_7'$. As a result, in the non-selected word driver $WD_1$, the current flowing through the resistor $R_X$ (FIG. 9B) or the resistors $R_{X1}$ and $R_{X2}$ (FIG. 9C) remains $I_X$. Contrary to this, in the write mode, the voltage $V_{RW}$ is lower than any of the reference voltages $V_{R1}$ or the voltages of the address signals, so that the current $(I_X \Delta I_X)$ flows only through one of the transistors $Q_5'$ and $Q_6'$. As a result, in the non-selected word driver $WD_1$, the current flowing through the resistor $R_X$ (FIG. 9B) or the resistors $R_{X1}$ and $R_{X2}$ (FIG. 9C) becomes $(I_X + \Delta I_X)$. However, in the selected word driver $W_0$, the voltage $V_X$ in FIG. 9B or 9C remains high ($\approx V_{CC}$) regardless of the write or read mode. Thus, the decoder/driver circuit of FIG. 16 can be also operated as illustrated in FIG. 5.

Figure 17:
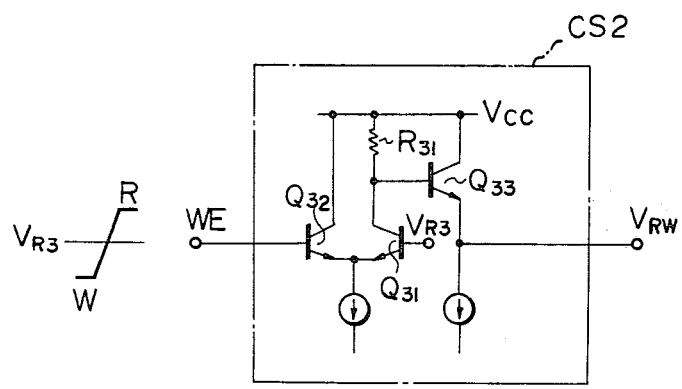
FIG. 17 is a circuit diagram of the current switching circuit CS2 of FIG. 16.

FIG. 17 is a circuit diagram of the current switching circuit CS2 of FIG. 16. In the write mode, since the voltage of the write enable signal WE is lower than the reference voltage $V_{R3}$, transistors $Q_{31}$ and $Q_{32}$ which form a current switch are conductive and non-conductive, respectively. As a result, the base voltage of a transistor $Q_{33}$ becomes low which tends to cause a decrease in the voltage $V_{RW}$. Contrary to this, in the read mode, since the voltage of the write enable signal WE is higher than the reference voltage $V_{R3}$, the transistors $Q_{31}$ and $Q_{32}$ are non-conductive and conductive, respectively. As a result, the base voltage of the transistor $Q_{33}$ becomes high, which tends to cause an increase of the voltage $V_{RW}$. Therefore, the base voltages of the transistors $Q_7'$ (FIG. 16) can be controlled by using the current switching circuit of FIG. 17.

Figure 18:
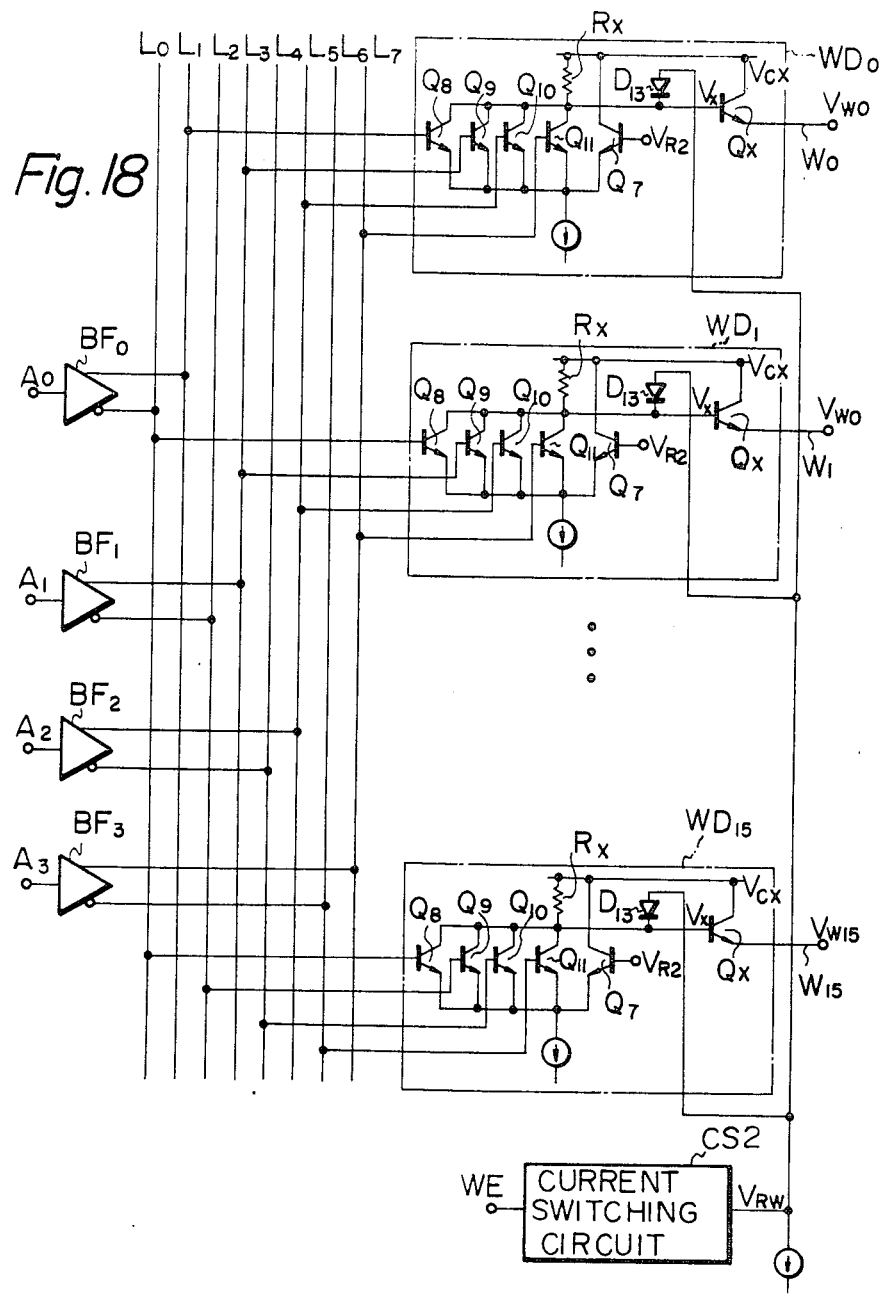
FIGS. 18, 19 and 20 are circuit diagrams illustrating fourth, fifth and sixth embodiments of the decoder/driver circuit of the present invention.

FIG. 18 is a circuit diagram illustrating a fourth embodiment of the decoder/driver circuit of the present invention. The elements in FIG. 18 which are identical to those of FIGS. 7 and 9A are denoted by the same reference numerals as used in FIGS. 7 and 9A. As may be understood from FIG. 18, each of the word drivers $WD_0$, $WD_1$, ..., $WD_{15}$ is the same as that of FIG. 9A, except that a diode $D_{13}$ which is controlled by the current switching circuit CS2 of FIG. 17 is provided. The output voltage $V_{RW}$ of the current switching circuit CS2 is applied to the anodes of the diodes $D_{13}$, while the cathodes of the diodes $D_{13}$ are connected to the bases of the transistors $Q_X$. As explained before, the current switching circuit CS2 produces a signal whose voltage $V_{RW}$ is low in the write mode and high in the read mode. Therefore, the diode $D_{13}$ is non-conductive in the write mode and conductive in the read mode. For example, in the non-selected word driver $WD_1$, the voltage $V_X$ in the write mode is determined by the voltage drop induced by the resistor $R_X$. In addition, the voltage $V_X$ in the read mode is higher than that in the write mode, since the diode $D_{13}$ is conductive. In other words, the voltage $V_X$ is clamped by the diode $D_{13}$. On the other hand, for example, in the selected word driver $WD_0$, the voltage $V_X$ is high regardless of the write or read mode. Thus, the decoder/driver circuit of FIG. 18 can be operated as illustrated in FIG. 5. It should be noted that emitter followers which serve as diodes can be used instead of the diodes $D_{13}$. The embodiment of FIG. 18 can be also used in FIG. 10.

Figure 19:
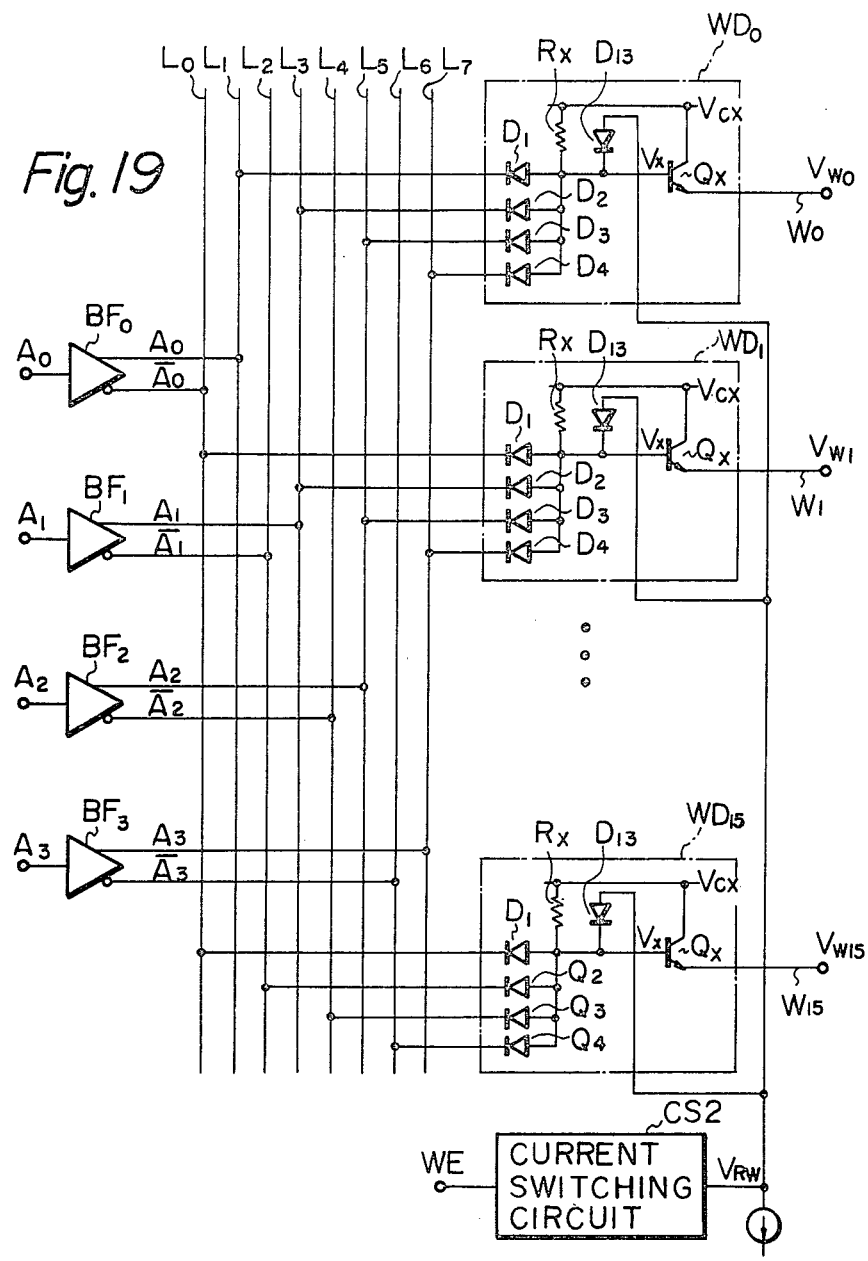
Figure 20:
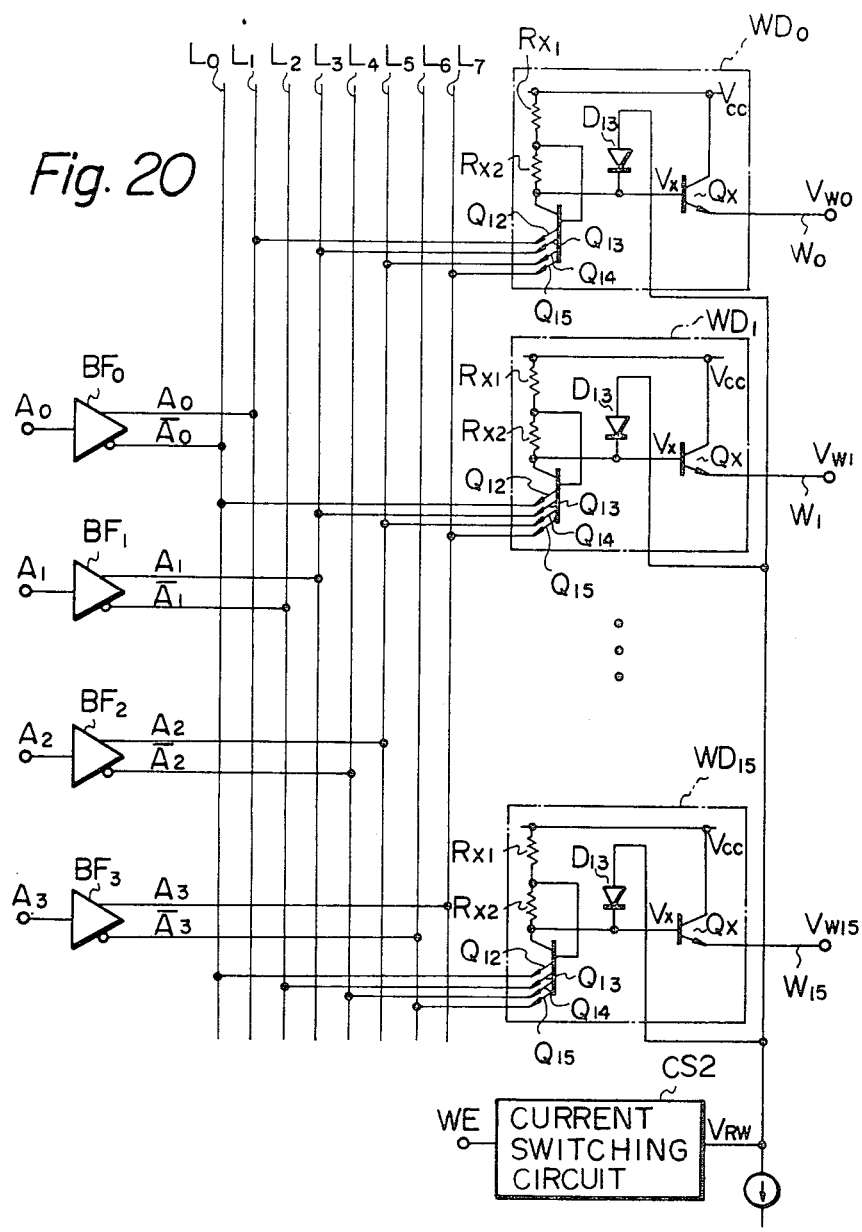

FIGS. 19 and 20 are circuit diagrams illustrating fifth and sixth embodiments of the decoder/driver circuit of the present invention. The decoder/driver circuits of FIGS. 19 and 20 are similar to that of FIG. 18. Each of the word drivers WD$_0$, WD$_1$, . . . , WD$_{15}$ in FIG. 19 is based on those in FIG. 9B, while each of those in FIG. 20 is based on those in FIG. 9C. In addition, the operation of the circuits of FIGS. 19 and 20 is the same as that of FIG. 18.

In the above-mentioned embodiments, the number of the word lines (word drivers) is 16. However, it goes without saying that the present invention can be also applied to a bipolar memory where the number of word lines is other than 16 such as 32, 64, or 128.

As explained above, the system for driving a bipolar RAM according to the present invention has the following advantages, as compared with those of the prior art.

(1) High reading speed can be obtained, since the difference in potential between the selected word line and the non-selected word lines is set at the margin of the read operation.

(2) Stable reading operation can be obtained, since the data written into a memory cell cannot be destroyed during the read mode after the write mode.

What is claimed is:

1. A system for driving a bipolar RAM having read and write modes, word lines having selected and nonselected states in accordance with respective, relatively higher and lower potentials thereof, and memory cells respectively associated with corresponding said word lines and which are addressed in accordance with the selected state of the respectively associated word line, said system comprising:
   first means changing the potentials of said word lines selectively to establish one of said word lines in the selected state and the remaining word lines in the non-selected state,
   second means for changing the potentials of said non-selected word lines relative to said selected word line, selectively in response to said read mode and to said write mode to said RAM so that the relative difference in potential between the selected word line and the non-selected word lines is greater during the write mode than during the read mode.

2. The system of claim 1, wherein said first means comprises:
   a plurality of driving transistors operatively connected to said word lines; and
   a third means for changing the base potentials of said driving transistors responsive to the selected state and the non-selected state thereof.

3. The system of claim 2 wherein said bipolar RAM being provided with address signals and, wherein said third means comprises:
   a plurality of resistors;
   the base of each of said driving transistors being correspondingly, operatively connected to one of said plurality of resistors;
   current sources for supplying corresponding resistors of said plurality of resistors with current; and
   decoder means for switching each current flowing through said resistors responsive to said address signals of said bipolar RAM.

4. The system of claim 3 comprising means for providing a write enable signal, said second means comprising a current switching circuit for controlling said current sources responsive to said write enable signal.

5. The system of claim 2 comprising means for providing a write enable signal, said second means comprising:
   a clamp circuit for clamping the base potentials of said driving transistors; and
   a current switch circuit for controlling said diode clamp circuit responsive to the write enable signal to clamp the base potentials of said driving transistors during the read mode.

6. The system of claim 5, wherein said clamp circuit comprises emitter followers which are connected between said current switching circuit and the bases of said driving transistors.

7. The system of claim 5, wherein said clamp circuit comprises emitter followers which are connected between said current switching circuit and the bases of said driving transistors.

8. The system of claim 1, wherein said first means comprises:
   a plurality of bus lines;
   a plurality of address buffers each operatively connected to one combination of said bus lines; and
   a plurality of word drivers each operatively connected to one combination of said bus lines and to one of the word lines.

9. The system of claim 8, operatively connected to a reference voltage, wherein each of said word drivers further comprises:
   a current switch, comprising a plurality of transistors operatively connected in parallel to said bus lines to which said word driver is operatively connected and one transistor operatively connected to the reference voltage, and further comprising a resistor in series with said plurality of transistors, whereby current flowing through said plurality of transistors causes an increased voltage drop across said resistor; and
   a driver transistor, operatively connected to said current switch, to said resistor, and to said word line of said word driver.

10. The system of claim 9, operatively connected to a write enable signal, wherein said second means comprises:
    a plurality of current sources operatively connected to each of said word drivers, comprising a transistor operatively connected to said current switch; and
    a current switching circuit, operatively connected to each of said current sources, and adapted to vary the current through each of said current sources in accordance with the write enable signal.

11. The system of claim 9, operatively connected to a write enable signal, wherein said second means comprises:
    a clamping diode, operatively connected to the base of said driver transistor of each of said word drivers; and
    a current switching circuit, operatively connected to each of said clamping diodes, for varying the voltage applied to said clamping diode in accordance with the write enable signal.

12. The system of claim 11 comprising:
    an emitter follower transistor, comprising said clamping diode as one junction thereof.

13. The system of claim 8, operatively connected to a current switching circuit, wherein each of said word drivers comprises:

a plurality of diodes, each operatively connected to one of the bus lines to which the word driver is operatively connected;
a resistor, having a first terminal operatively connected to each of said diodes;
a driver transistor, operatively connected to the word line and to said first terminal of said resistor; and
a clamping diode, operatively connected to the base of said driver transistor and to the current switching circuit.

14. The system of claim 8, operatively connected to a current switching circuit, wherein each of said word drivers comprises:
a multi-emitter transistor comprising a collector, and a plurality of emitter elements each operatively connected to one of the bus lines to which the word driver is operatively connected;
a resistor, operatively connected to the collector element of said multi-element transistor;
a driver transistor operatively connected to the word line, comprising a base operatively connected to the collector element of said multi-element transistor; and
a clamping diode, operatively connected between the base of said driver transistor and the current switching circuit.

15. The system of claim 8, operatively connected to a reference voltage, to a plurality of address bits, and to a current switching circuit, wherein each of said address buffers comprises:
a current switch, comprising a plurality of transistors operatively controlled by the reference voltage and by one or more of the address bits and respectively connected to each of the bus lines to which the address buffer is connected; and
a transistor operatively connected to all of the elements of said current switch and having a base operatively connected to the current switching circuit.

16. The system of claim 8, operatively connected to a current switching circuit, to a first and a second constant current source, to a reference voltage, to a power supply line and to a plurality of address bits, wherein each of said address buffers comprises:
a first current switch, comprising a first and a second transistor element, controlled by one of the address bits and by the reference voltage respectively, and operatively connected between the first current source and the bus lines; and
a second current switch, comprising third, fourth, and fifth transistor elements, operatively connected to the second current source and controlled respectively by one of the address bits, by the reference voltage, and by the current switching circuit, and having said third and said fourth transistor elements operatively connected to the bus lines.

17. A system according to claim 8, claim 9, claim 10, claim 11, claim 12, claim 13, claim 14, claim 15, or claim 16, operatively connected to receive a plurality of address bits, wherein:
each of said address buffers further comprises four address outputs, operatively connected to four of said bus lines respectively;
each of said address buffers is operatively connected to two of the address bits; and
each of said word drivers is operatively connected to exactly one of the four bus lines to which each of said address buffers is operatively connected.

18. A system according to claim 8, claim 9, claim 10, claim 11, claim 12, claim 13, claim 14, claim 15, or claim 26, operatively connected to a plurality of address bits, wherein:
each of said address buffers is operatively connected to one of the address bits;
each of said address buffers is connected to exactly two of the bus lines;
each of said bus lines is connected to exactly one address buffer; and
each of said word drivers is operatively connected to exactly one of the two bus lines to which each of said address buffers is operatively connected.

19. A bipolar memory system, comprising the combination of:
the system of claim 8, claim 9, claim 10, claim 11, claim 12, claim 13, claim 14, claim 15, or claim 16, with:
a plurality of pairs of bit lines;
a plurality of bit drivers, each operatively connected to one of said pairs of bit lines;
a sense amplifier, operatively connected to each of said pairs of bit lines;
a plurality of memory cells, each operatively connected to one of said pairs of bit lines and to one of the word lines; and
a plurality of hold lines, operatively connected to said memory cells.

20. The memory system of claim 19, where each of said memory cells comprises:
a pair of cross-coupled multi-emitter transistors, operatively connected to the hold line to which said memory cell is connected, to the pair of bit lines to which said memory cell is connected, and to the word line to which said memory cell is connected; and
a pair of load resistors, operatively connected to said pair of cross-coupled multi-emitter transistors.

21. The memory system of claim 20 where each of said memory cells further comprises:
a pair of Schottky barrier diodes operatively connected to said pair of cross-coupled multi-emitter transistors.

22. The memory system of claim 19, where each of said memory cells is an Integrated Injection Logic cell, comprising:
a flip-flop, comprising a pair of cross-coupled transistor elements, and operatively connected to the word line, to the hold line, and to the pair of bit lines to which said memory cell is connected; and
a load element, comprising a second pair of transistor elements operatively connected to said flip-flop.

23. An address buffer for providing a bus line current selectively along first and second output lines, having means for receiving an address bit, a constant reference voltage, and a signal from a current switching circuit, said address buffer comprising:
first means for selectively switching the bus line current to one of the first and second output lines in accordance with the status of the address bit; and
second means for controlling the amount of the bus line current in accordance with the signal received from the current switching circuit.

24. The address buffer of claim 23, wherein:
said second means comprises:
a current source, controlled by the signal received from the current switching circuit;
and said first means comprises:

a current switch, comprising first and second transistors operatively connected to one terminal of said current source, respectively controlled by the address bit and by the constant reference voltage, and respectively operatively connected to the first and second output lines.

25. The address buffer of claim 23, wherein said first means comprises:

a current switch comprising first and second transistor elements controlled respectively by the address bit and by the constant reference voltage, and which are both operatively connected to a first constant current source and respectively operatively connected to the first and the second output lines;

and said second means comprises:

a second current switch comprising third, fourth, and fifth transistor elements which are controlled respectively by the address bit, by said constant reference voltage, and by the signal received from current switching circuit, and which are all operatively connected to a second constant current source and respectively operatively connected to the first output line, to the second output line, and to the power supply.

26. A word driver for driving a word line into a selected or non-selected state defined as levels of potential, operatively connected to a reference voltage, to a power supply, to a plurality of bus lines having active and inactive states, and to a current switching circuit having read and write states, said word driver comprising:

a first means for driving the word line at the potential corresponding to said selected state of the word line if and only if all of the bus lines are in an active state; and a second means for selectively driving the word line, only if any one of the bus lines is in an inactive state, at the potential corresponding to the non-selected state of the word line in accordance with the read or write state of the current switching circuit.

27. The word driver of claim 26, wherein said first means comprises:

a current switch, comprising a plurality of transistors one of said transistors controlled by each bus line to which said word driver is operatively connected and one of said transistors being controlled by the reference voltage, and further comprising a resistor in series with said transistors of said current switch connected to said bus lines, whereby current flowing through the transistors of said current switch connected to said bus lines, causes an increased voltage drop across said resistor; and a driver transistor, operatively connected to said current switch, to said resistor, and to the word line.

28. The word driver of claim 27, wherein said second means comprises:

a current source, operatively connected to said current swtich, and controlled by the current switching circuit to which it is operatively connected.

29. The word driver of claim 27, wherein said second means comprises:

a clamping diode, operatively connected between the current switching circuit and the base of said driver transistor.

30. The word driver of claim 26, wherein said first means comprises:

a driver transistor, operatively connected to the word line and to the power supply;

a resistor, operatively connected between the base of said driver transistor and the power supply;

a plurality of diodes, each operatively connected between the base of said driver transistor and one of the bus lines;

and said second means comprises:

a clamping diode, operatively connected between the base of said driver transistor and the current switching circuit.

31. The word driver of claim 26, wherein said first means comprises:

a multi-emitter transistor, having a plurality of emitter elements each connected to one of the bus lines;

a driver transistor, operatively connected between the power supply and the word line;

a resistor, operatively connected between said power supply and the base of said driver transistor;

and said second means comprises:

a clamping diode, operatively connected between the base of said driver transistor and the current switching circuit.

32. A word driver according to claim 29, claim 30, or claim 31, wherein said clamping diode further comprises a second junction and is operatively connected as an emitter follower.

33. A current switching circuit, operatively connected to a write enable signal, comprising:

first means, operatively connected to the write enable signal, for providing a first output which is varied in accordance with the write enable signal;

second means for supplying constant current to a second output;

third means operatively connected to said first output and to said second output for providing a third output with a constant current controlled in accordance with said first output.

34. The current switching circuit of claim 33, operatively connected to a power supply line, to a ground line, and to a reference voltage, wherein:

said first means further comprises:

a current switch comprising a first and a second transistor controlled respectively by the write enable signal and by the reference voltage;

a first resistor having one end operatively connected to the power supply line and the other end operatively connected to said first transistor and to the first output.

35. The device of claim 34, wherein:

said second means further comprises:

a fourth transistor, operatively connected to the ground line and to the second output;

an eighth transistor operatively connected to the ground line, operatively connected to the power supply line, and having a base operatively connected to the base of said fourth transistor;

a seventh transistor, operatively connected to the base of said eighth transistor;

one or more diodes, operatively connected between the power supply line and the ground line in series with eighth transistor.

36. The current switching circuit of claim 33, claim 34, or claim 35, wherein said third means further comprises:

a transistor $Q_{XS}$, operatively connected to said third output; and one or more transistor amplifier stages operatively connected to the base of said transistor $Q_{XS}$ and to said first output and said second output.

37. A current switching circuit, operatively connected to a write enable signal, to a reference voltage, and to a power supply line, and having an output terminal, comprising:

a current switch comprising first and second transistors controlled respectively by the write enable signal and by the reference voltage, said first transistor being operatively connected to the power supply line;

a resistor, operatively connected between the power supply line and said second transistor; and a third transistor, operatively connected between the power supply line and the output terminal, having a base operatively connected to said second transistor.

* * * * *

UNITED STATES PATENT AND TRADEMARK OFFICE
CERTIFICATE OF CORRECTION

PATENT NO. : 4,348,747

DATED : September 7, 1982

INVENTOR(S) : Takahashi

It is certified that error appears in the above—identified patent and that said Letters Patent is hereby corrected as shown below:

Front page, second column, in the Abstract [57], line 1, "biopolar" should be --bipolar--;

Col. 1, line 17, "work" should be --word--;
      line 26, "of" (second occurrence) should be --for--.

Col. 2, line 56, "decoder/-" should be --decoder/--.

Col. 3, line 50, "$SBD_2$cuts" should be --$SBD_2$ cuts--.

Col. 4, line 43, "$I_D=0$" should be --$\overline{I}_D=0$--;
      line 52, "wherein" should be --where--.

Col. 5, line 11, "$V_D$" should be --$\overline{V}_D$--;
      line 21, "$(=V_D)$" should be --$(=\overline{V}_D)$--.

Col. 6, line 35, "$\overline{A}_2$" should be --$\overline{A}_2$,--.

Col. 7, line 42, "$A_2A_3$" (first occurrence) should be --$A_2\overline{A}_3$--;

Col. 7, line 47, "$A_0A_1$" (second occurrence) should be --$\overline{A}_0\overline{A}_1$--.

UNITED STATES PATENT AND TRADEMARK OFFICE
CERTIFICATE OF CORRECTION

PATENT NO. : 4,348,747
DATED : September 7, 1982
INVENTOR(S) : Takahashi

It is certified that error appears in the above—identified patent and that said Letters Patent is hereby corrected as shown below:

Col. 8, line 2, "decoder/circuit" should be --decoder/driver circuit--.

Col. 9, line 9, "$3V_{BE}$" should be -- $=3V_{BE}$ --;

line 22, "cause" should be --causes--;

line 65, "$Q_7$" should be --$Q_7'$--.

Col. 10, line 10, "$(I_X \Delta I_X)$" should be --$(I_X + \Delta I_X)$--.

Col. 11, line 33, after "means" insert --for--;
line 40, "to" (second occurrence) should be --of--.

Col. 14, claim 21, line 1, after "20" insert --,--.

Signed and Sealed this

Nineteenth Day of April 1983

[SEAL]

Attest:

Attesting Officer

GERALD J. MOSSINGHOFF

Commissioner of Patents and Trademarks